(12) United States Patent
Hobo et al.

(10) Patent No.: US 10,705,164 B2
(45) Date of Patent: Jul. 7, 2020

(54) MAGNETIC RESONANCE SIGNAL DETECTION MODULE

(71) Applicant: JEOL Ltd., Tokyo (JP)

(72) Inventors: Fumio Hobo, Tokyo (JP); Katsuyuki Toshima, Tokyo (JP); Shinji Nakamura, Tokyo (JP); Shigenori Tsuji, Tokyo (JP); Ryoji Tanaka, Tokyo (JP); Hiroto Suematsu, Tokyo (JP)

(73) Assignee: JEOL Ltd., Tokyo (JP)

( * ) Notice: Subject to any disclaimer, the term of this patent is extended or adjusted under 35 U.S.C. 154(b) by 353 days.

(21) Appl. No.: 15/592,787

(22) Filed: May 11, 2017

(65) Prior Publication Data

US 2017/0336485 A1 Nov. 23, 2017

(30) Foreign Application Priority Data

May 13, 2016 (JP) ................................ 2016-097338

(51) Int. Cl.
*G01R 33/34* (2006.01)
*G01R 33/30* (2006.01)
*G01R 33/36* (2006.01)
*G01R 33/565* (2006.01)

(52) U.S. Cl.
CPC ..... *G01R 33/34023* (2013.01); *G01R 33/307* (2013.01); *G01R 33/3403* (2013.01); *G01R 33/34007* (2013.01); *G01R 33/34092* (2013.01); *G01R 33/3628* (2013.01); *G01R 33/5659* (2013.01)

(58) Field of Classification Search
CPC ............ G01R 33/34023; G01R 33/307; G01R 33/34007; G01R 33/3403; G01R 33/34092; G01R 33/3628; G01R 33/5659
USPC .......................... 324/300–322; 600/407–435
See application file for complete search history.

(56) References Cited

U.S. PATENT DOCUMENTS 5,565,778 A 10/1996 Brey et al.
6,377,047 B1 * 4/2002 Wong ............... G01R 33/34076
324/318

(Continued)

FOREIGN PATENT DOCUMENTS

JP 2002328156 A 11/2002
JP 2003302453 A 10/2003
JP 2011510261 A 3/2011

OTHER PUBLICATIONS

Anlage, "High Temperature Superconducting Radio Frequency Coils for NMR Spectroscopy and Magnetic Resonance Imaging", Microwave Superconductivity, ed. by H. Weinstock and M. Nisenoff, (Kluwer, Amsterdam, 2001), pp. 337-352.

(Continued)

*Primary Examiner* — Rishi R Patel
(74) *Attorney, Agent, or Firm* — The Webb Law Firm

(57) ABSTRACT

A pair of detection coils, one coil provided on each side of a sample container across the width of the sample container. The detection coil is made of a superconductor and has an electric circuit pattern capable of detecting a magnetic resonance signal from a sample. The detection coil includes a lateral component intersectional to a static magnetic field $H_0$ and having a part disposed at a position spaced away from a detection region, as compared to the remaining part.

7 Claims, 11 Drawing Sheets

(56) References Cited

U.S. PATENT DOCUMENTS

| | | | |
|---|---|---|---|
| 6,556,013 B2 * | 4/2003 | Withers | G01R 33/34061 |
| | | | 324/318 |
| 6,727,700 B2 * | 4/2004 | Marek | G01R 33/34046 |
| | | | 324/318 |
| 6,842,004 B2 * | 1/2005 | Withers | G01R 33/341 |
| | | | 324/318 |
| 7,446,532 B1 | 11/2008 | Burns | |
| 2002/0190715 A1 * | 12/2002 | Marek | G01R 33/34046 |
| | | | 324/318 |
| 2003/0052682 A1 * | 3/2003 | Withers | G01R 33/34061 |
| | | | 324/322 |
| 2003/0141871 A1 | 7/2003 | Marek | |
| 2004/0032262 A1 * | 2/2004 | Withers | G01R 33/34061 |
| | | | 324/318 |

OTHER PUBLICATIONS

Brey et al. "Design, construction, and validation of a 1-mm triple-resonance high-temperature-superconducting probe for NMR", Journal of Magnetic Resonance, 179, (2006) pp. 290-293.

* cited by examiner

MAGNETIC RESONANCE SIGNAL DETECTION MODULE

CROSS REFERENCE TO RELATED APPLICATION

The entire disclosure of Japanese Patent Application No. 2016-097338 filed on May 13, 2016 including the specification, claims, drawings, and abstract is incorporated herein by reference in its entirety.

TECHNICAL FIELD

The present disclosure relates to a magnetic resonance signal detection module and, more particularly, to a module including a superconductor circuit usable as a magnetic resonance signal detection circuit.

BACKGROUND

Nuclear magnetic resonance (NMR) measuring apparatuses and electron spin resonance (ESR) measuring apparatuses are conventionally known as representative magnetic resonance measuring apparatuses. Magnetic resonance imaging (MRI) apparatuses are known as being similar to the NMR measuring apparatuses. Hereinafter, the NMR measuring apparatus will be described in detail below.

The NMR is a phenomenon caused by atomic nuclei placed in a static magnetic field that interact with electromagnetic waves of specific frequencies. The NMR measuring apparatus is an apparatus capable of utilizing such a phenomenon to measure a sample at an atomic level. The NMR measuring apparatus can be practically used in analyses of organic compounds (e.g., chemicals and pesticides), high polymer materials (e.g., vinyl and polyethylene), and biological materials (e.g., nucleic acids and proteins). For example, the NMR measuring apparatus enables a user to examine the molecular structure of a sample.

The NMR apparatus includes an NMR probe (i.e., NMR signal detection probe) placed together with a sample in a superconducting magnet that generates a static magnetic field. The NMR probe includes a detection coil for transmission and reception. The detection coil has a function of applying a variable magnetic field to the sample in a transmission state and a function of receiving an NMR signal from the sample in a reception state. The resonance frequency is variable depending on an observation target nuclide. Therefore, in the measurement of the sample, a high-frequency signal having a particular frequency adapted to the observation target nuclide is given to the coil.

The uniformity of an external magnetic field in a sample space plays an important role in improving the detection accuracy of the NMR signal. If the external magnetic field is not uniform in the sample space, the NMR signal may be erroneously detected. The cause of generating such a non-uniform external magnetic field is, for example, magnetization of a member that approaches the sample space. In particular, the detection coil for detecting the NMR signal may generate a disturbed magnetic field in the sample space if the magnetization of the coil is finite. In general, an NMR apparatus having higher resolution includes a shimming apparatus that can correct the magnetic field distribution in the sample space. However, the practical order of the correction is limited to a lower order. If a detection coil has a complicated shape, it is generally difficult to correct a non-uniform magnetic field caused by the magnetization of the coil. Therefore, in a detection coil that approaches the sample space and has a complicated shape, the magnetization of the material must decrease down to zero as much as possible.

Further, it is conventionally known that Faraday's law of electromagnetic induction is employable in a method for detecting the NMR signal. The noise dominant in this method is Johnson noise. The Johnson noise is known to be proportional to the square root of the coil temperature or the square root of the electric resistance of the coil.

As discussed in the reference "High Temperature Superconducting Radio Frequency Coils for NMR Spectroscopy and Magnetic Resonance Imaging," Steven M. Anlage, "Microwave Superconductivity," ed. by H. Weinstock and M. Nisenoff, (Kluwer, Amsterdam, 2001), pp. 337-352, a detection coil made of a superconductor is conventionally known. When a superconductor is cooled, the electric resistance of the superconductor becomes substantially zero. Therefore, the above-mentioned noise can be reduced and the detection sensitivity of the NMR signal can be improved.

Selecting a superconductor as a detection coil material is useful in that the thermal noise signal can be reduced. However, the superconductor possesses strong magnetic shield characteristics induced by superconductive phenomenon. The above-mentioned property possibly causes a disturbance in the uniformity of a magnetic field in the sample space. As a result, the sample filling rate (i.e., the ratio of the volume of a measurement target sample to the volume of the detection coil) decreases and the S/N ratio of the NMR signal decreases.

The sample filling rate is mentioned in the reference "High Temperature Superconducting Radio Frequency Coils for NMR Spectroscopy and Magnetic Resonance Imaging," Steven M. Anlage, "Microwave Superconductivity," ed. by H. Weinstock and M. Nisenoff, (Kluwer, Amsterdam, 2001), pp. 337-352. When the sample filling rate of a metallic detection coil in a room-temperature environment is 1, the sample filling rate of a superconductive detection coil in a low-temperature environment is approximately 0.2. In general, the detection sensitivity is proportional to the square root of the sample filling rate. Therefore, if the employed detection coil is made of a superconductor, a relative reduction in the detection sensitivity is approximately 0.45 times. One of the reasons why the sample filling rate of a superconductive detection coil is kept low is that the superconductive detection coil is forcibly isolated from the sample to avoid the non-uniformity of the magnetic field caused by the superconductive detection coil. The sample filling rate decreases with increasing distance between the detection coil and the sample. As a result, the detection sensitivity decreases correspondingly.

As discussed in the reference "Design, construction, and validation of a 1-mm triple-resonance high-temperature-superconducting probe for NMR" William W. Brey et. al., Journal of Magnetic Resonance 179 (2006) 290-293 and U.S. Pat. No. 5,565,778, it is conventionally known that the superconductive detection coil can be configured to include a slit to suppress the generation of shield current that may cause magnetic shield generation. Providing such a slit is effective in suppressing the generation of large shield current. However, smaller residual shield current may flow through a plurality of coil portions separated by the slit. The entire amount of the shield current rises up to a level corresponding to a sum of the separated coil portions. Further, the above-mentioned slit is not effective in preventing a magnetization component parallel to the magnetic field from generating a non-uniform magnetic field.

The present disclosure intends to provide a magnetic resonance signal detection module including a detection coil made of a superconductor, which can improve the detection sensitivity while suppressing the reduction of the sample filling rate of the detection coil as much as possible.

SUMMARY

A magnetic resonance signal detection module according to the present disclosure includes a pair of detection coils provided at respective ends of a sample container. The detection coil is made of a superconductor and has an electric circuit pattern capable of detecting a magnetic resonance signal from a sample. The detection coil includes a lateral component intersectional to a static magnetic field and having a part disposed at a position spaced away from a detection region of the sample, as compared to the remaining part.

The above-mentioned configuration brings preferable effects of eliminating or suppressing the non-uniformity of the magnetic field in the detection region because the part of the lateral component contributing the non-uniformity of the magnetic field is disposed at a position spaced away from the detection region, as compared to the remaining part. Further, the above-mentioned configuration brings preferable effects of suppressing the reduction of the sample filling rate of the detection coil as much as possible, because the line length of the detection coil is shorter as compared to a case where the lateral component is entirely spaced away from the detection region. Thus, the detection sensitivity can be improved.

A type II superconductor is usable as an example of the superconductor. The detection region is a region determined beforehand in relation to a sample and is a measurement target region. The direction going away from the detection region can be a direction parallel to the static magnetic field or can be a direction perpendicular to the static magnetic field. Further, the direction going away from the detection region can be a direction between the above-mentioned parallel direction and the above-mentioned perpendicular direction.

It is desired that the width of the part of the lateral component is 1.1 to 2.0 times the width of the sample container. When the width of the part of the lateral component is less than the width of the sample container, the effects of suppressing the non-uniformity of the magnetic field will be reduced. When the width of the part of the lateral component is greater than 2.0 times the width of the sample container, the line length of the detection coil becomes longer correspondingly, and accordingly the sample filling rate decreases. As a result, the detection sensitivity decreases. Accordingly, the above-mentioned configuration brings preferable effects of suppressing the reduction of the sample filling rate as much as possible, while adequately suppressing the non-uniformity of the magnetic field. Thus, the detection sensitivity can be improved.

It is desired that the lateral component has a stepwise shape, and the part of the lateral component protrudes in a direction going away from the detection region.

It is desired that the lateral component has a protruding shape narrowing in a direction going away from the detection region and flattened at a distal end thereof, and the part of the lateral component is the distal end portion.

It is desired that the part of the lateral component is a component perpendicular to the static magnetic field.

It is desired that the lateral component has a protruding shape narrowing in a direction going away from the detection region.

It is desired that at least a part of the lateral component has a curved shape.

It is desired that the part of the lateral component is disposed at a position spaced away in a direction parallel to or perpendicular to the static magnetic field.

According to the present disclosure, the magnetic resonance signal detection module including the detection coil made of a superconductor can improve the detection sensitivity while suppressing the reduction of the sample filling rate of the detection coil as much as possible.

BRIEF DESCRIPTION OF DRAWINGS

Embodiment(s) of the present disclosure will be described by reference to on the following figures, wherein.

DESCRIPTION OF EMBODIMENTS

Figure 1:
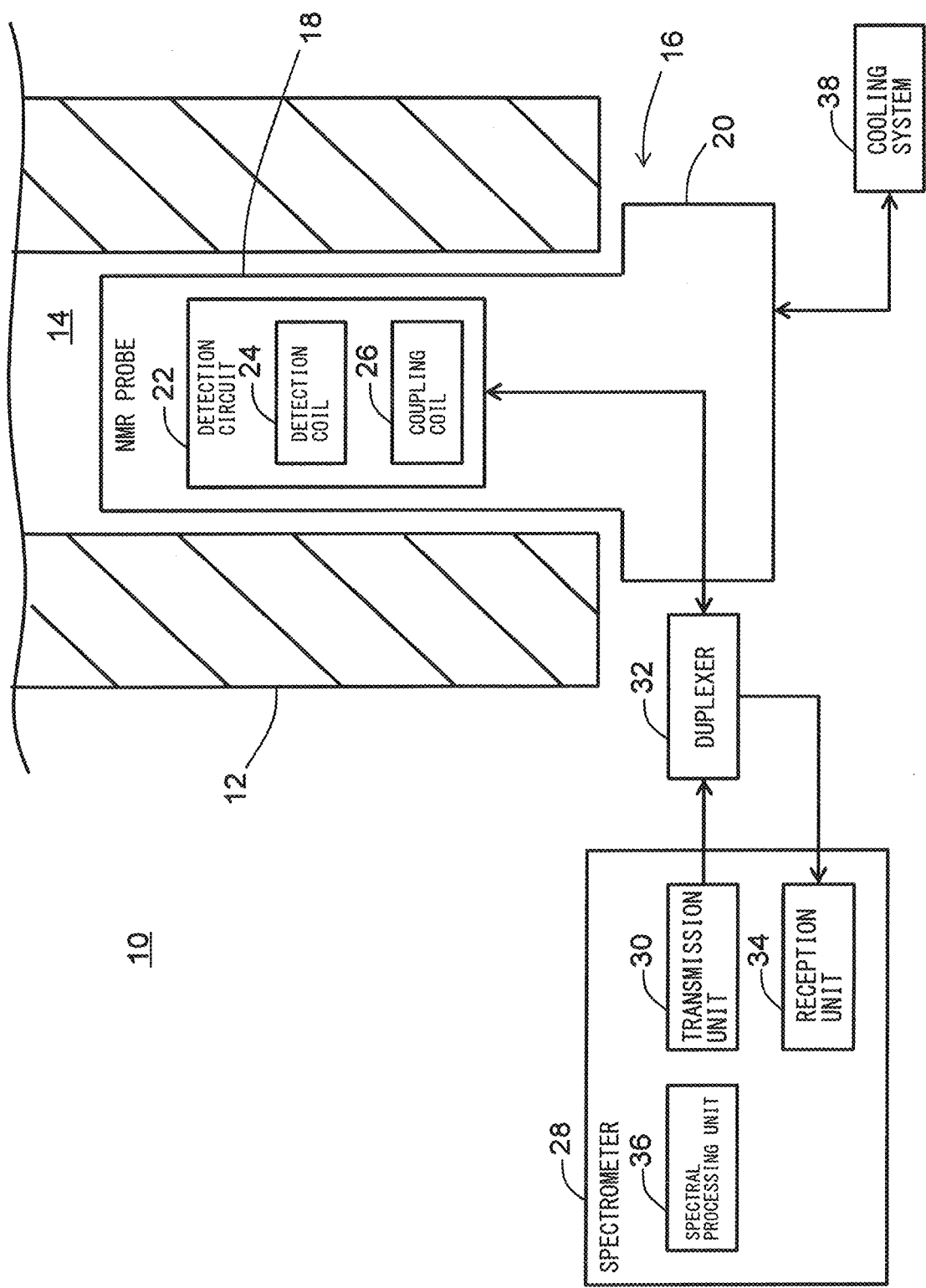
FIG. 1 is a block diagram illustrating an NMR apparatus.

Embodiments of the present invention will be described in detail below. FIG. 1 illustrates an NMR apparatus 10 according to an embodiment of the present invention. The NMR apparatus 10 can measure NMR signals generated by observation nuclei contained in a sample.

A static magnetic field generating apparatus 12 can generate a static magnetic field. The static magnetic field generating apparatus 12 includes a bore 14 formed at the central portion thereof. The bore 14 is a cavity extending in the vertical direction. An NMR probe 16 is roughly constituted by an insertion portion 18 and a base portion 20. The insertion portion 18 has a cylindrical shape entirely extending in the vertical direction. The insertion portion 18 can be inserted into the bore 14 of the static magnetic field generating apparatus 12.

The insertion portion 18 includes a probe head in which a detection circuit 22 is provided. The detection circuit 22 is a tuning and matching circuit, which includes a detection coil 24 capable of detecting the NMR signal and a coupling coil 26 for transmission and reception. The detection circuit 22 further includes a tuning variable capacitor and a matching variable capacitor, as other electronic components. The coupling coil 26, which may be referred to as a pickup coil or a transmission/reception coil, can generate a variable magnetic field in an irradiation time zone (i.e., transmission period) and can receive an NMR signal detected by the detection coil 24 in an observation time zone (i.e., reception period). Characteristics of the detection circuit 22 can be optimized by appropriately selecting setting values (e.g., capacitances) of the tuning variable capacitor and the matching variable capacitor. In other words, tuning and matching can be realized. As a modified embodiment, the coupling coil 26 can be replaced by appropriate wiring that can realize the transmission and reception by the detection coil 24.

A spectrometer 28 includes a transmission unit 30, which includes a signal generator and a power amplifier to generate and output a transmission signal. In an NMR measurement mode, the natural frequency of an observation target is set as the frequency of the transmission signal. The transmission signal output from the transmission unit 30 can be transmitted to the detection circuit 22 in the NMR probe 16 via a duplexer 32 (i.e., transmission/reception switching device). As a modified embodiment, the duplexer 32 can be disposed in the NMR probe 16.

A reception unit 34 of the spectrometer 28 can receive the NMR signal (i.e., reception signal) detected by the detection coil 24 via the duplexer 32. The reception unit 34 has a conventional circuit configuration including a quadrature detection circuit and an A/D converter and can perform predetermined processing on the reception signal. The reception signal processed by the reception unit 34 can be transmitted to a spectral processing unit 36. The spectral processing unit 36 can generate a spectral spectrum by performing FFT processing on the reception signal and can perform required analysis on the generated spectrum. The spectrometer 28 includes a display unit (not illustrated) that can display a processing result obtained by the spectral processing unit 36. Further, the spectrometer 28 includes an input unit that enables a user to perform various settings for a measurement target. As a modified embodiment, a computer is employable as the spectral processing unit 36.

A cooling system 38 includes, for example, a refrigerator that can cool helium gas. The cooling system 38 can supply the cooled helium gas to the NMR probe 16. In other words, the cooling system 38 is a system capable of cooling a component to be cooled provided in the NMR probe 16. For example, the component to be cooled can be cooled down to a temperature of 20K or less.

Figure 2:
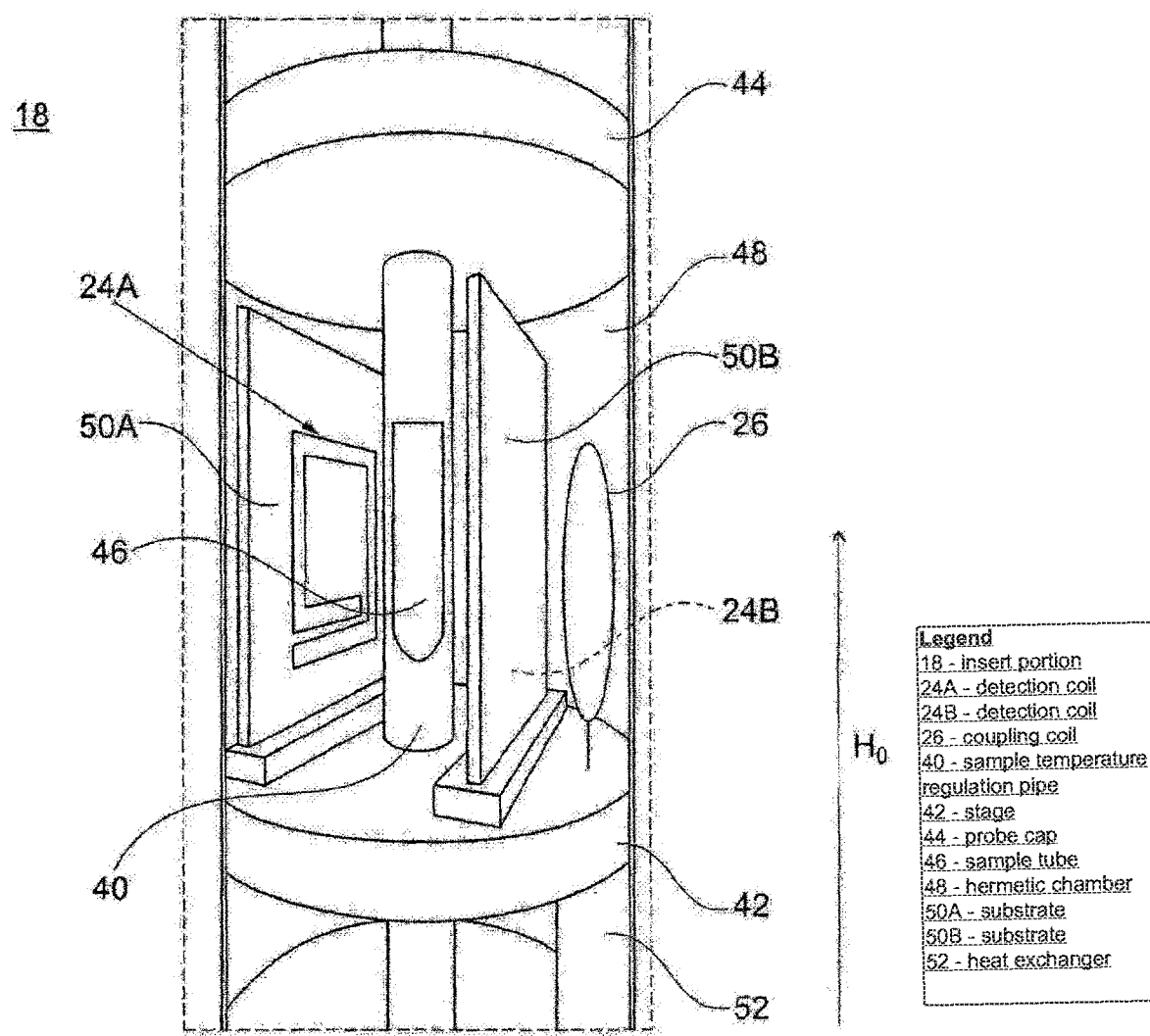
FIG. 2 is a perspective view illustrating a sample chamber and a detection coil.

FIG. 2 schematically illustrates a sample chamber and a detection coil. The NMR probe 16 has a sample temperature regulation pipe 40 provided in the insertion portion 18. The sample temperature regulation pipe 40 is, for example, a glass tube, which extends through a stage 42 and a probe cap 44. A sample tube 46, in which a sample can be accommodated, is disposed in the sample temperature regulation pipe 40. The sample tube or container 46 has a length substantially perpendicular to the static magnetic field $H_0$ and a width substantially perpendicular to the static magnetic field $H_0$. The insertion portion 18 is disposed in the bore 14 of the static magnetic field generating apparatus 12 in such a manner that the centers of the sample and the sample tube 46 coincide with the center of a static magnetic field $H_0$. The inside of the sample temperature regulation pipe 40 is an atmospheric space. The inner temperature of the sample temperature regulation pipe 40 can be maintained, for example, at room temperature. Thus, the sample is located in the atmospheric space and the temperature of the sample can be maintained at room temperature.

A hermetic chamber 48 is formed between the sample temperature regulation pipe 40 and an outer wall of the insertion portion 18. The hermetic chamber 48 is kept in a vacuum state. The detection circuit 22 (including the detection coil 24 constituted by detection coils 24A and 24B, the coupling coil 26, the tuning variable capacitor, and the matching variable capacitor) is placed in the vacuumed hermetic chamber 48. The detection coil 24A is a planar coil and is a thin-film detection circuit pattern (electric circuit pattern) formed on a substrate 50A. Although not illustrated in the drawings, the detection coil 24B is a similar planar coil and is a thin-film detection circuit pattern formed on a substrate 50B. Each of the detection coils 24A and 24B is made of a superconductor. The type II superconductor is usable as an example of the superconductor. An example of the material usable as the superconductor is $YBa_2Cu_3O_7$ (YBCO, Y123), although another material can be used. The detection coils 24A and 24B constitute a pair of detection coils. Each of the substrates 50A and 50B is, for example, a sapphire substrate. The sample and the sample temperature regulation pipe 40 are positioned between the substrates 50A and 50B. The substrates 50A and 50B are held by a detection coil jig in such a manner that the detection coils 24A and 24B are positioned substantially parallel to the static magnetic field $H_0$ formed by the static magnetic field generating apparatus 12 or are inclined at a predetermined angle relative to the static magnetic field $H_0$.

The detection coil 24A is a coil pattern formed on the substrate 50A and includes an inductance element L and a capacitance element C. Although not illustrated in the drawings, the detection coil 24B similarly includes an inductance element L and a capacitance element C. Configuring an LC resonance circuit is feasible by employing the above-mentioned configuration. FIG. 2 illustrates a schematic shape of the detection coil 24A. The shape of the detection coil according to the present embodiment will be described in detail below with reference to FIG. 4.

In the above-mentioned configuration, the detection circuit 22 is a component to be cooled and can be cooled down to extremely low temperature. To improve the S/N of the signal, the variable capacitors are also cooled together with the detection coils 24A and 24B and the coupling coil 26. For example, a cooling system (i.e., a cryostat cooling system) discussed in Japanese Patent Application Laid-Open No. 2014-41103 is usable as a cooling mechanism. More specifically, helium gas cooled by the cooling system 38 is introduced into a heat exchanger 52 connected to the stage 42. The heat exchanger 52 can be cooled down to an extremely low temperature (e.g., 20K or less). Accordingly, it is feasible to cool the component to be cooled. When the detection coils 24A and 24B are cooled, the electric resistances of the detection coils 24A and 24B decrease. As a result, the detection sensitivity in the NMR measurement can be improved. Although not illustrated in the drawings, the NMR probe 16 includes a temperature sensor capable of detecting the temperature of the component to be cooled.

Figure 3:
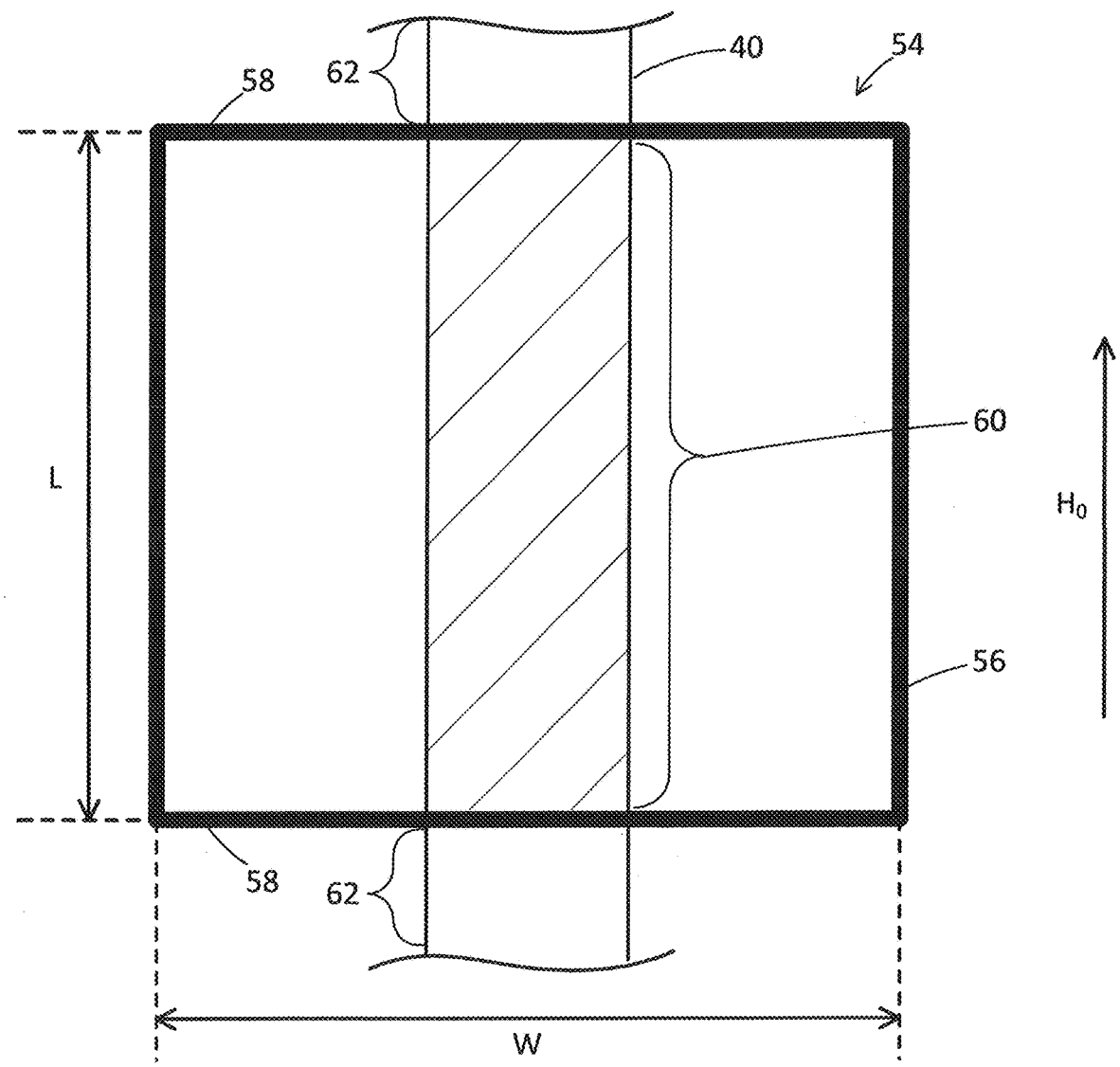
FIG. 3 illustrates a detection coil according to a comparative example.

Hereinafter, a comparative example will be described with reference to FIG. 3. FIG. 3 illustrates a detection coil 54 according to the comparative example. An NMR probe according to the comparative example includes a pair of detection coils 54, which can serve as the above-mentioned paired detection coils 24A and 24B. The detection coil 54 is made of a superconductor and includes a rectangular detection circuit pattern. Although not illustrated in the drawings, the detection coil 54 includes an inductance element L and a capacitance element C. More specifically, the detection coil 54 is constituted by two longitudinal components 56 and two lateral components 58. Each longitudinal component 56 is disposed in parallel with the static magnetic field $H_0$ formed by the static magnetic field generating apparatus 12. Each lateral component 58 is disposed perpendicularly to the static magnetic field $H_0$. Coil window length L indicates the longitudinal width of the detection coil 54; namely, the entire size of the longitudinal component 56. Coil width W indicates the entire lateral width of the detection coil 54; namely, the entire size of the lateral component 58. When "d" represents the distance between the paired detection coils, the coil width W can be expressed by the following formula.

$$W = d \times \tan(\Omega)$$

For example, $\Omega$ is 120 [deg]. A sample accommodated in the sample tube 46 (not illustrated) is placed in the sample temperature regulation pipe 40. The sample temperature regulation pipe 40 includes a detection region 60, which is an actual MNR measurement target region. The detection coil 54 detects an NMR signal from the sample disposed in the detection region 60. The sample temperature regulation pipe 40 further includes two non-detection regions 62 provided on respective sides of the detection region 60. A magnetic shield, which is made of aluminum or the like, is provided in the non-detection region 62. Therefore, in a case where a sample is positioned in the non-detection region 62, the detection coil 54 does not detect any NMR signal from the sample located in the non-detection region 62. As an example configuration of the detection coil 54, the coil window length L of the detection coil 54 is equal to the longitudinal width of the detection region 60 (i.e., the width in the direction parallel to the static magnetic field $H_0$).

Three events that may occur when the lateral component 58 of the detection coil 54 approaches the sample space (i.e., the detection region 60) will be described in detail below.

(1) Non-Uniformity of Magnetic Field

In a case where the detection coil is inclined relative to the static magnetic field $H_0$ by an angle $\theta$, magnetization M of the detection coil can be expressed by the following formula (1).

$$M = |M_1| \cos \theta + |M_2| \sin \theta \quad (1)$$

In the formula (1), $M_1$ represents a magnetization component parallel to a sample surface and $M_2$ represents a magnetization component perpendicular to the sample surface. It is now assumed that the angle $\theta$ is sufficiently small. When the angle $\theta$ is small, the magnetization component $M_2$ can be regarded as an apparent magnetization according to the Meissner effect generated by shield current flowing in the vicinity of the sample. When the material is thin, $M_2 \gg M_1$ and the magnetization M greatly depends on the angle $\theta$. Further, the sign of the magnetization M is variable depending on the angle $\theta$. More specifically, if the angle $\theta$ cannot be controlled, the magnetization M varies and the sign (plus/minus) of the magnetization M changes depending on the angle $\theta$. When the distribution of the magnetization M is uniform across the detection coil, the lateral component 58 forms a large non-uniform magnetic field in the sample space (i.e., the detection region 60). This is because two opposing lateral components 58 can be regarded as an electric dipole having magnetic poles, and the distribution of the magnetic field is centered on the magnetic poles. Therefore, when the lateral component 58 approaches the sample space, the uniformity of the magnetic field in the sample space becomes worse. More specifically, locating the lateral component 58 away from the sample space is useful for eliminating or suppressing the non-uniformity of the magnetic field in the sample space.

(2) Non-Uniform High-Frequency Magnetic Field

When the detection coil is a planar coil, the uniformity of the high-frequency magnetic field tends to decrease in the vicinity of upper and lower ends of the coil window (namely, in the vicinity of the lateral component 58). Preventing or suppressing decrease in uniformity of the high-frequency magnetic field is feasible by locating the lateral component 58 away from the sample space (i.e., the detection region 60).

(3) Influence of Sample Dielectric Loss

When capacitive loads are designed in such a way as to be positioned at the upper and lower portions (i.e., the lateral components 58) of the detection coil, the electric field concentrates on the upper and lower portions of the coil window and therefore it becomes feasible to lessen the influence of the sample dielectric loss. Further lessening the influence of the above-mentioned dielectric loss is feasible by locating the capacitive load away from the sample space (i.e., the detection region 60).

As mentioned above, it becomes feasible to eliminate or suppress the uniformity of the magnetic field by locating the lateral component of the detection coil away from the sample space (i.e., the detection region 60). Further, it becomes feasible to eliminate or suppress the reduction of the uniformity of the high-frequency magnetic field. The influence of the dielectric loss can be further lessened. On the other hand, if the lateral component of the detection coil is located excessively far away from the sample space (i.e., the detection region 60), the line length of the detection coil becomes longer correspondingly and therefore the sample filling rate decreases. As a result, the detection sensitivity decreases. To solve the above-mentioned problems, the detection coil according to the present embodiment is configured to have a part of the lateral component located at a position spaced away from the detection region 60, as compared to the remaining part of lateral component. Hereinafter, the detection coil according to the present embodiment will be described in detail below.

Figure 4:
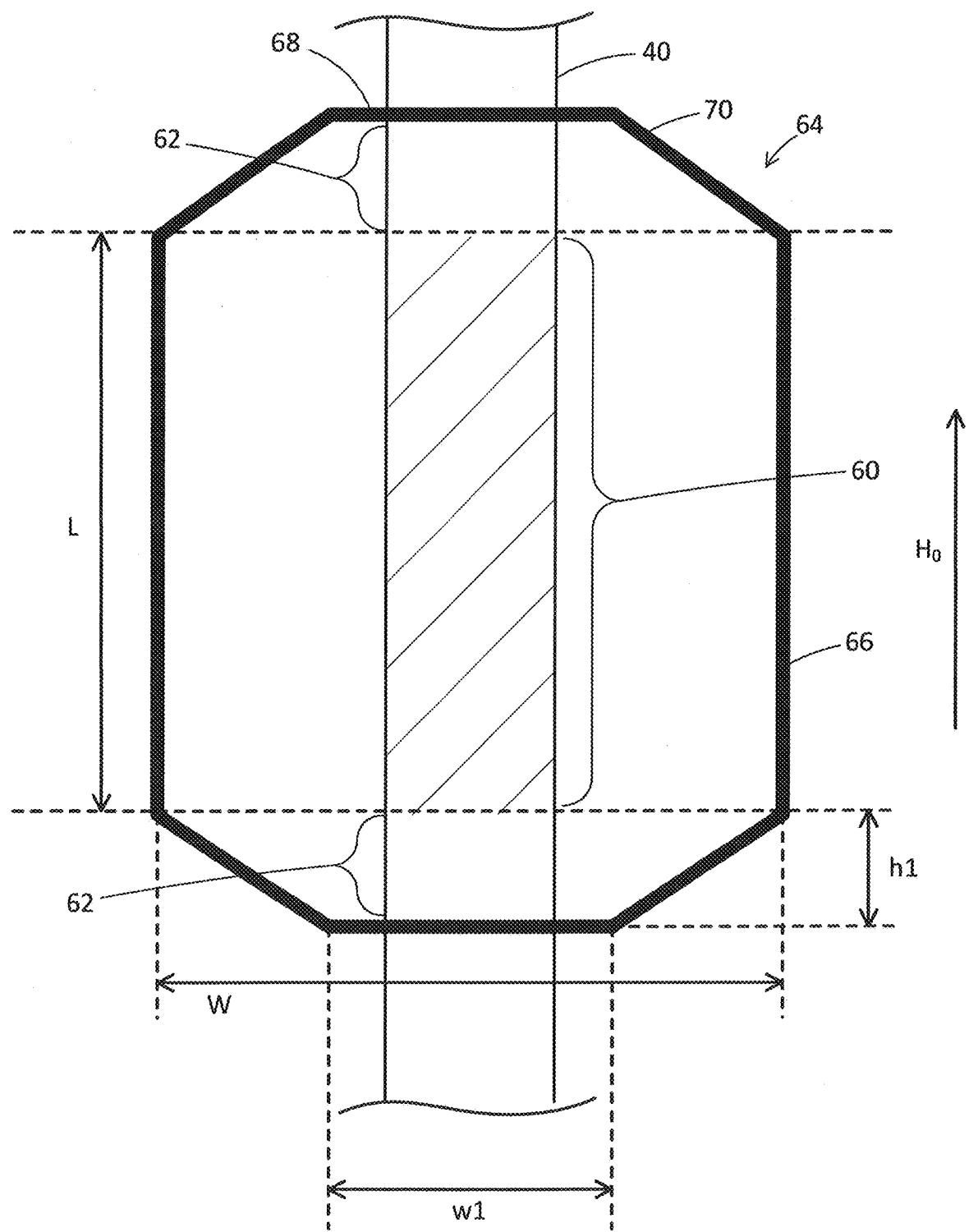
FIG. 4 illustrates a detection coil according to an embodiment of the present disclosure.

FIG. 4 illustrates a detection coil 64 according to the present embodiment. An NMR probe according to the present embodiment includes a pair of detection coils 64 serving as the above-mentioned paired detection coils 24A and 24B. The detection coil 64 is made of a superconductor and has a detection circuit pattern. Although not illustrated in the drawings, the detection coil 64 includes an inductance element L and a capacitance element C. The detection coil 64 is different from the detection coil 54 according to the above-mentioned comparative example in that a part of the lateral component has a shape protruding in the direction of the static magnetic field $H_0$. The detection coil 64 includes longitudinal components 66 each extending in parallel with the static magnetic field $H_0$. The coil window length L is equal to the entire size of the longitudinal component 66 and is equal to the longitudinal width of the detection coil 54 according to the comparative example (i.e., the entire size of the longitudinal component 56). As an example, the coil window length L of the detection coil 64 is equal to the longitudinal width of the detection region 60 (i.e., the size in the direction parallel to the static magnetic field $H_0$). The detection coil 64 detects an NMR signal from a sample located in the detection region 60 and does not detect any NMR signal from a sample located in the non-detection region 62. Coil width W indicates the entire lateral width of the detection coil 64. The lateral component of the detection coil 64 has a protruding shape narrowing in the direction going away from the detection region 60 and flattened at a distal end thereof. According to the example illustrated in FIG. 4, the direction going away from the detection region 60 is the direction parallel to the static magnetic field $H_0$. As a modified embodiment, the direction going away from the detection region 60 can be a direction other than the direction parallel to the static magnetic field $H_0$. A part 68 of the lateral component of the detection coil 64 is the above-mentioned flattened distal end portion and is positioned away from the detection region 60, as compared to the remaining part 70. The part 68 of the lateral component is a component disposed perpendicularly to the static magnetic field $H_0$, and the remaining part 70 is a component disposed at an inclined with respect to the static magnetic field $H_0$.

Width w1 indicates the width of the part 68 of the lateral component. The part 68 of the lateral component is located at a position spaced away from the upper end portion of the longitudinal component 66 by a distance h1. According to the example illustrated in FIG. 4, the part 68 of one lateral component (i.e., the part 68 of the upper lateral component) of the detection coil 64 is disposed at a position spaced away from a closest end portion of the longitudinal component 66 by the distance h1 in the direction parallel to the static magnetic field $H_0$. Similarly, the part 68 of the other lateral component opposing the above-mentioned lateral component (i.e., the part 68 of the lower lateral component) is disposed at a position spaced away from the closest (the other) end portion of the longitudinal component 66 by the distance h1 in the direction parallel to the static magnetic field $H_0$. More specifically, the detection coil 64 includes the upper and lower lateral components each having the part 68 protruding in the direction parallel to the static magnetic field $H_0$, as compared to the detection coil 54 according to the comparative example. As a modified embodiment, the detection coil 64 can include either the upper lateral component or the lower lateral component that is configured to have the protruding part 68 disposed at the position spaced away from the closest end portion of the longitudinal component 66 by the distance h1. For example, the part 68 of one lateral component is disposed at the position spaced away from the closest end portion of the longitudinal component 66 by the distance h1. On the other hand, the part 68 of the other lateral component is positioned adjacently to the other end portion of the longitudinal component 66, similar to the detection coil 54 according to the comparative example. As another modified example, the upper lateral component and the lower lateral component can be differentiated in the distance h1 of each part 68 protruding from the closest end portion of the longitudinal component 66 even when both of the parts 68 of the upper and lower lateral components are configured to be vertically spaced away from the detection region 60.

As mentioned above, at least a part of the lateral component of the detection coil 64 is disposed at the position spaced away from the detection region 60. Therefore, it becomes feasible to lessen the influence of the strong shield current generating in a superconductive material. Further, it becomes feasible to eliminate or suppress the non-uniformity of the magnetic field in the detection region 60. Further, as compared to a case where the lateral component is entirely positioned away from the detection region 60, the line length of the detection coil 64 becomes shorter. Therefore, the reduction of the sample filling rate of the detection coil 64 can be prevented or suppressed as much as possible. Using the detection coil 64 according to the present embodiment brings preferable effects of improving the detection sensitivity. Further, the present embodiment brings preferable effects of suppressing the reduction of the sample filling rate, as compared to a case where a pair of detection coils 64 is spaced away from each other to keep a long distance between the paired detection coils 64. Further, while suppressing the reduction of the sample filling rate of the detection coil 64 as much as possible, the present embodiment brings preferable effects of preventing or suppressing the uniformity of the high-frequency magnetic field from decreasing and lessening the influence of the dielectric loss.

When φs represents the width of the sample tube 46, it is desired that the width w1 falls within a range of 1.1 φs to 2.0 φs. It is more desired that the width w1 is 1.5 φs. When the width w1 is less than 1.0 φs, the effects of suppressing the non-uniformity of the magnetic field decrease. When the width w1 is greater than 2.0 φs, the line length of the detection coil 64 becomes longer correspondingly and the sample filling rate decreases. As a result, the detection sensitivity decreases. When the width w1 is in the range of 1.1 φs to 2.0 φs, the non-uniformity of the magnetic field can be adequately suppressed and the reduction of the sample filling rate can be suppressed as much as possible.

The distance h1 is a distance sufficient or effective in eliminating or suppressing the non-uniformity of the magnetic field in the detection region 60. As an example, the distance h1 can be expressed by the following formula (2), in which the unit is millimeter.

[Formula 2]

$$h_1 \geq \sqrt{2.5^2 - \left(\frac{\Delta - \varphi_s}{2}\right)^2} \quad (2)$$

In formula (2), Δ represents the distance between the paired detection coils 64. For example, a relationship h1≥1.9 mm can be derived from the formula (2) when φs=5 mm and Δ=8.2 mm. When the distance h1 is shorter, the reduction of the sample filling rate of the detection coil 64 can be efficiently suppressed.

Hereinafter, a practical embodiment will be described in detail below. The superconductive material practically used in this case for the detection coil, is YBCO. Setting values are L=16 mm, W=15 mm, φs=5 mm, Δ=8.2 mm, and w1=7.3 mm.

Figure 5:
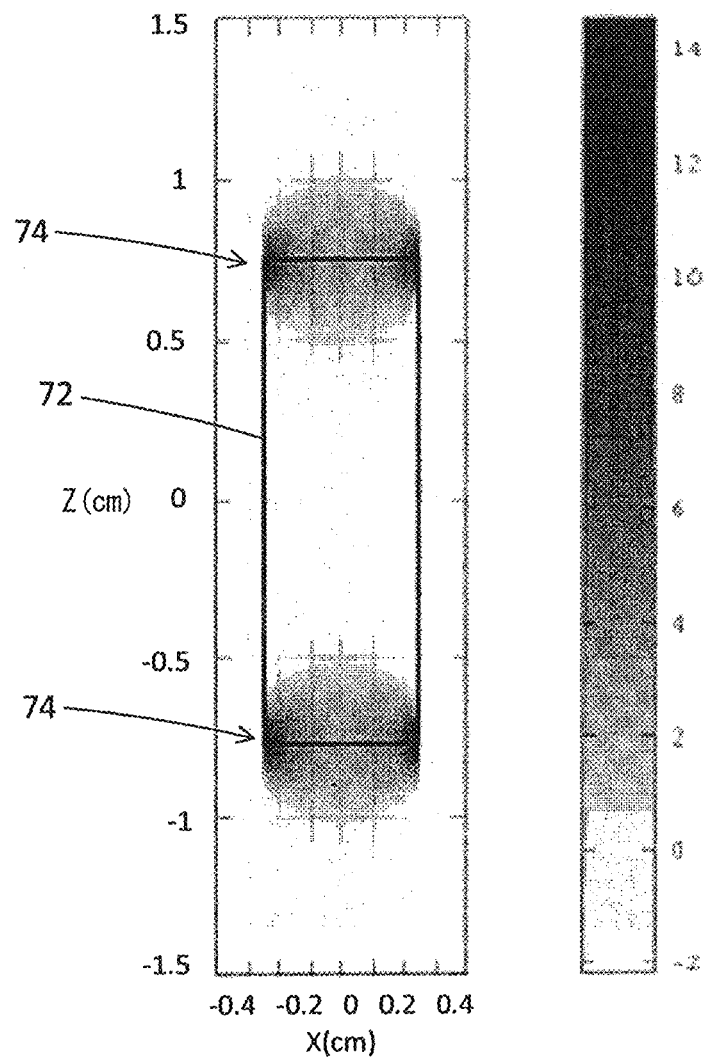
FIG. 5 illustrates a magnetic field distribution according to a comparative example.

FIG. 5 illustrates the distribution of a magnetic field generated in the sample space (i.e., the detection region 60) when the detection coil 54 according to the comparative example is employed. More specifically, FIG. 5 illustrates a magnetic field distribution obtainable when h1=0. A rectangular frame 72 indicates a region corresponding to the detection region 60. In the comparative example, the lateral components 58 of the detection coil 54 are disposed at upper and lower ends of the detection region 60. Therefore, a large magnetic field corresponding to 14 Hz is distributed non-uniformly in regions 74 corresponding to the upper and lower ends of the detection region 60. More specifically, the magnetic field is distributed non-uniformly in the upper and lower end portions of the detection region 60 (i.e., the sample space).

Figure 6:
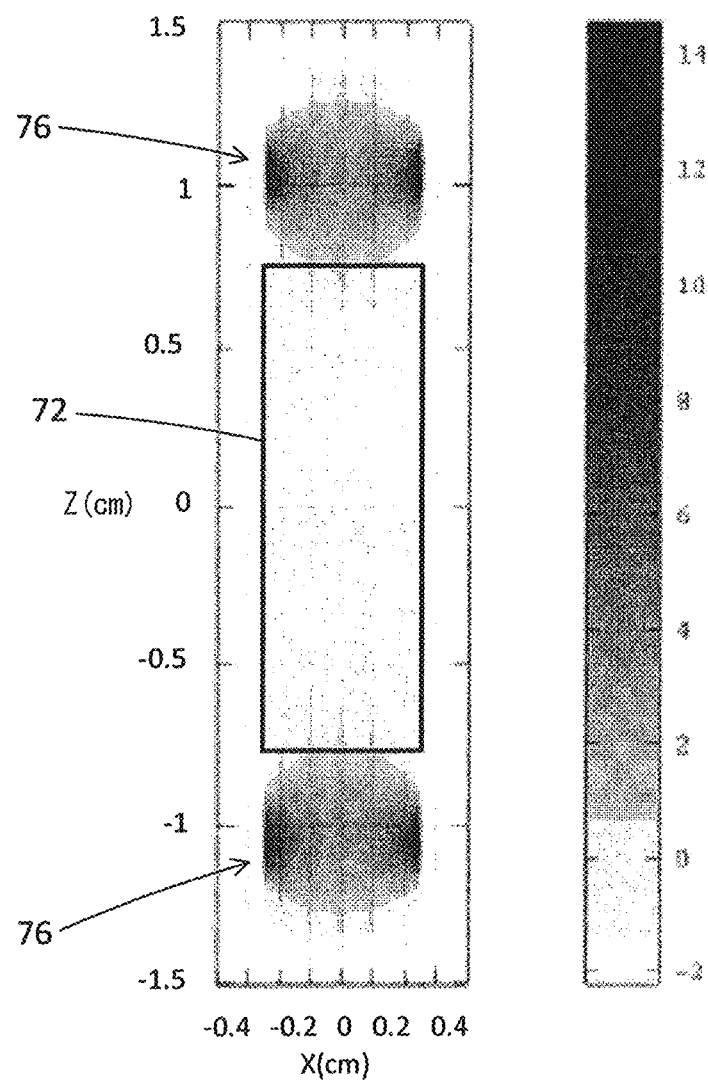
FIG. 6 illustrates a magnetic field distribution according to the present embodiment.

FIG. 6 illustrates the distribution of a magnetic field generated in the sample space (i.e., the detection region 60) when the detection coil 64 according to the present embodiment is employed. FIG. 6 illustrates a magnetic field distribution obtainable when h1=2 mm. In the present embodiment, the part 68 of the lateral component is disposed at a position spaced away from the closest one of the upper and lower ends of the detection region 60 by the distance h1 in the direction parallel to the static magnetic field $H_0$. Therefore, a large magnetic field is distributed non-uniformly in a region 76 corresponding to the position spaced away from the closest one of the upper and lower ends of the detection region 60 by the distance h1 in the direction parallel to the static magnetic field $H_0$. However, the distribution of the magnetic field is substantially uniform at the upper and lower ends of the detection region 60. More specifically, the magnetic field is uniformly distributed in the detection region 60 (i.e., the sample space). As mentioned above, when the distance h1 is equal to or greater than 2 mm, it is feasible to obtain sufficient uniformity of the magnetic field in the detection region 60 (i.e., the sample space).

Figure 7:
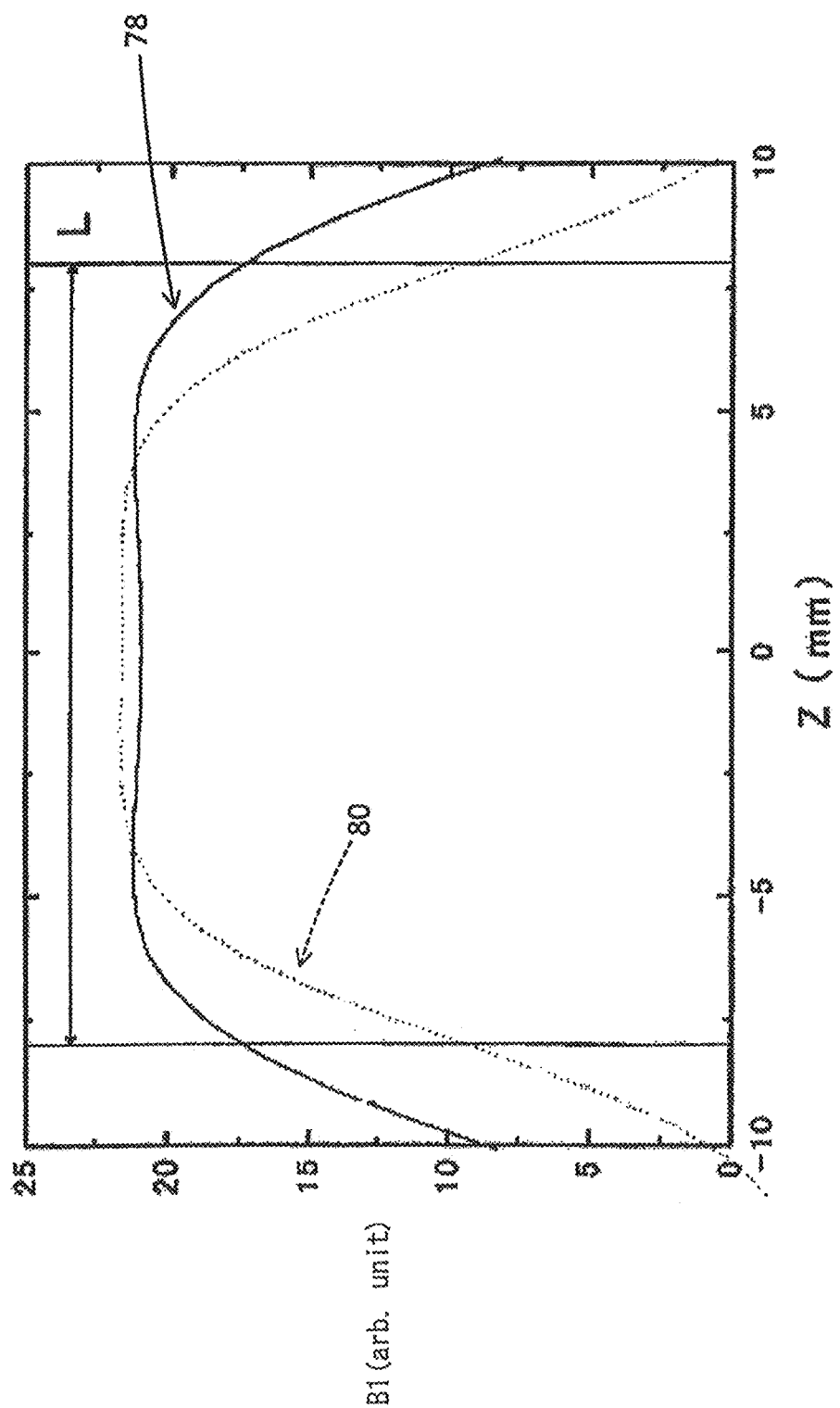
FIG. 7 illustrates an intensity distribution of a high-frequency magnetic field.

FIG. 7 illustrates an intensity distribution of the high-frequency magnetic field formed on the central axis when the line width of the detection coil is 1.0 mm. The horizontal axis indicates the distance in the direction parallel to the static magnetic field $H_0$. The vertical axis indicates the intensity of the high-frequency magnetic field. A solid line 78 indicates an intensity distribution obtainable when h1=2 mm (i.e., intensity distribution obtainable when the detection coil 64 according to the present embodiment is employed). A dotted line 80 indicates an intensity distribution obtainable when h1=0 (i.e., intensity distribution obtainable when the detection coil 54 according to the comparative example is employed). As indicated by the solid line 78, according to the present embodiment, the uniformity of the high-frequency magnetic field can be improved in the coil window (i.e., in the range of the coil window length L), as compared to the comparative example. In particular, the uniformity of the high-frequency magnetic field can be improved at the upper and lower ends of the detection region 60 (i.e., the sample space).

Further, according to trial calculations for obtaining the sample filling rate discussed in the reference "High Temperature Superconducting Radio Frequency Coils for NMR Spectroscopy and Magnetic Resonance Imaging," Steven M. Anlage, "Microwave Superconductivity," ed. by H. Weinstock and M. Nisenoff, (Kluwer, Amsterdam, 2001), pp. 337-352, when the sample filling rate of a room-temperature probe is 1 (i.e., reference value), the sample filling rate in the present embodiment (e.g., h1=2 mm) is η=0.30 and the sample filling rate in the comparative example (h1=0 mm) is η=0.34. Although the sample filling rate in the comparative example is higher than the sample filling rate in the present embodiment, the magnetic field is not entirely uniform in the sample space (i.e., the detection region 60) and the range of the uniform magnetic field is narrower than that in the present embodiment, as described with reference to FIG. 5. On the other hand, although the sample filling rate in the present embodiment is slightly lower than the sample filling rate in the comparative example, the magnetic field is substantially uniform in the sample space (i.e., the detection region 60) and the range of the uniform magnetic field is wider than that in the comparative example, as described with reference to FIG. 6. As mentioned above, the present embodiment brings preferable effects of eliminating or suppressing the non-uniformity of the magnetic field in the sample space (i.e., the detection region 60) while suppressing the reduction of the sample filling rate of the detection coil as much as possible. As a result, the detection sensitivity can be improved. If a longer distance is kept between a pair of detection coils to eliminate or suppress the non-uniformity of the magnetic field, the sample filling rate will be decreased to η=0.2. When the sample filling rate decreases greatly, the detection sensitivity decreases greatly.

Some modified embodiments will be described in detail below.

(Modified Embodiment 1)

Figure 8:
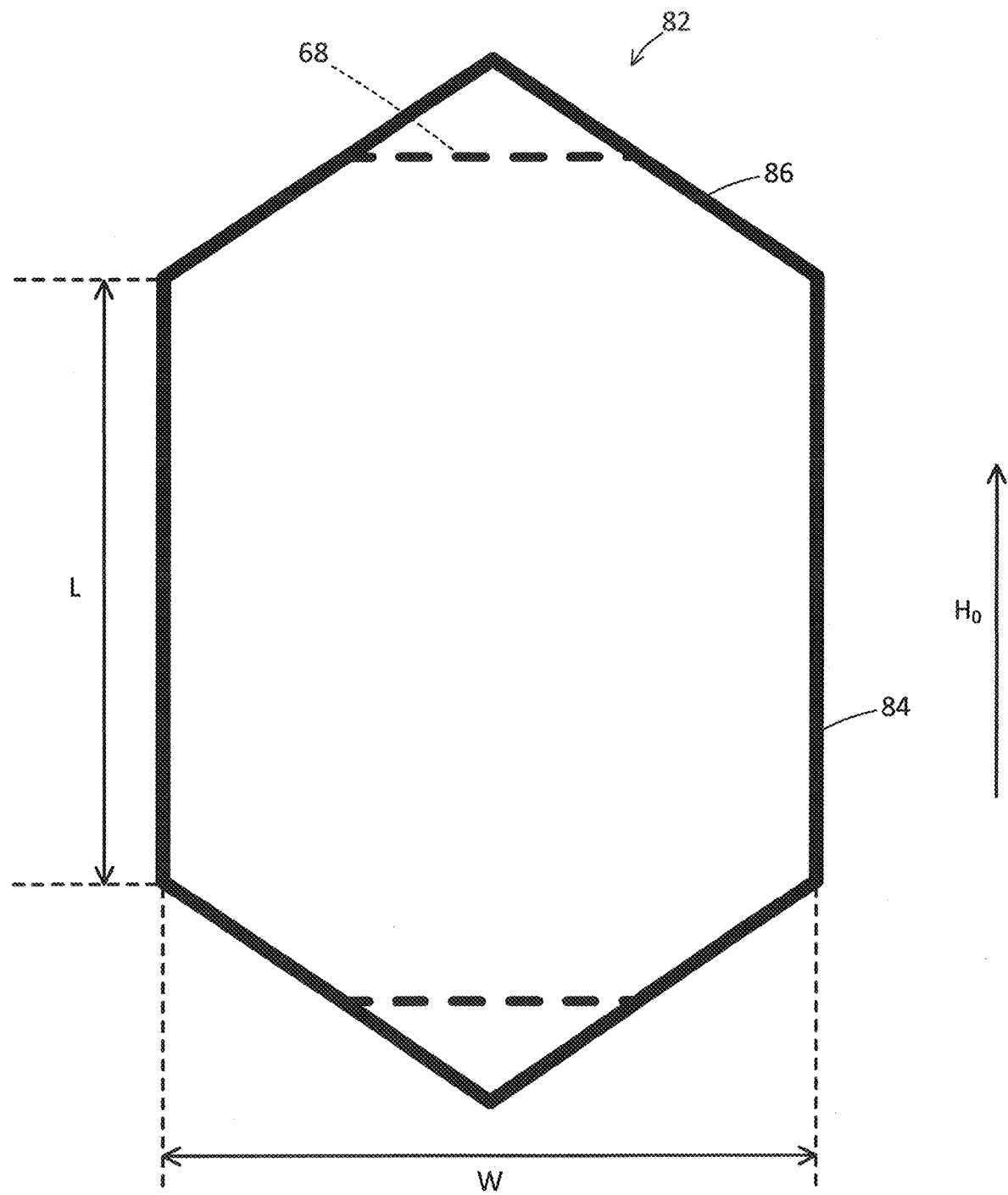
FIG. 8 illustrates a detection coil according to a modified embodiment 1.

A modified embodiment 1 relating to the detection coil according to the above-mentioned embodiment will be described in detail below with reference to FIG. 8. FIG. 8 illustrates a detection coil 82 according to the modified embodiment 1. FIG. 8 additionally illustrates dotted lines each indicating the part 68 of the lateral component of the detection coil 64 according to the above-mentioned embodiment. In an NMR probe according to the modified embodiment 1, a pair of detection coils 82 serve as the above-mentioned detection coils 24A and 24B. Each detection coil 82 is made of a superconductor and has a detection circuit pattern. Although not illustrated in the drawings, the detection coil 82 includes an inductance element L and a capacitance element C. The detection coil 82 includes longitudinal components 84 each extending in parallel with the static magnetic field $H_0$. Coil window length L indicates the entire size of the longitudinal component 84, which is equal to the longitudinal width of the detection coil 54 according to the comparative example (i.e., the entire size of the longitudinal component 56). In the detection coil 82, as an example, the coil window length L of the detection coil 82 is equal to the longitudinal width of the detection region 60 (not illustrated). Coil width W indicates the entire lateral width of the detection coil 82. The detection coil 82 includes lateral components 86 each having a shape narrowing in the direction going away from the detection region 60 (not illustrated). According to the example illustrated in FIG. 8, the direction going away from the detection region 60 is the direction parallel to the static magnetic field $H_0$. Needless to say, the direction going away from the detection region 60 can be a direction other than the direction parallel to the static magnetic field $H_0$. The lateral component 86 is a component disposed at an incline with respect to the static magnetic field $H_0$.

According to the example illustrated in FIG. 8, one lateral component 86 (i.e., the upper lateral component 86) of the detection coil 82 has a shape narrowing in the direction going away from the detection region 60. Similarly, the other lateral component 86 (i.e., the lower lateral component 86) of the detection coil 82 has a shape narrowing in the direction going away from the detection region 60. More specifically, the detection coil 82 includes the upper and lower lateral components 86 each having the shape narrowing in the direction going away from the detection region 60. Needless to say, either the upper lateral component 86 or the lower lateral component 86 can be configured to have the shape narrowing in the direction going away from the detection region 60. As another example, the upper lateral component 86 and the lower lateral component 86 can be differentiated in shape even when each of the upper and lateral components 86 has the shape narrowing in the direction going away from the detection region 60.

The above-mentioned modified embodiment 1 brings preferable effects of eliminating or suppressing the non-uniformity of the magnetic field in the detection region 60 because the lateral component 86 of the detection coil 82 is disposed at the position spaced away from the detection region 60. Further, the modified embodiment 1 brings preferable effects of suppressing the reduction of the sample filling rate of the detection coil 82 as much as possible. Thus, the detection sensitivity can be improved.

(Modified Embodiment 2)

Figure 9:
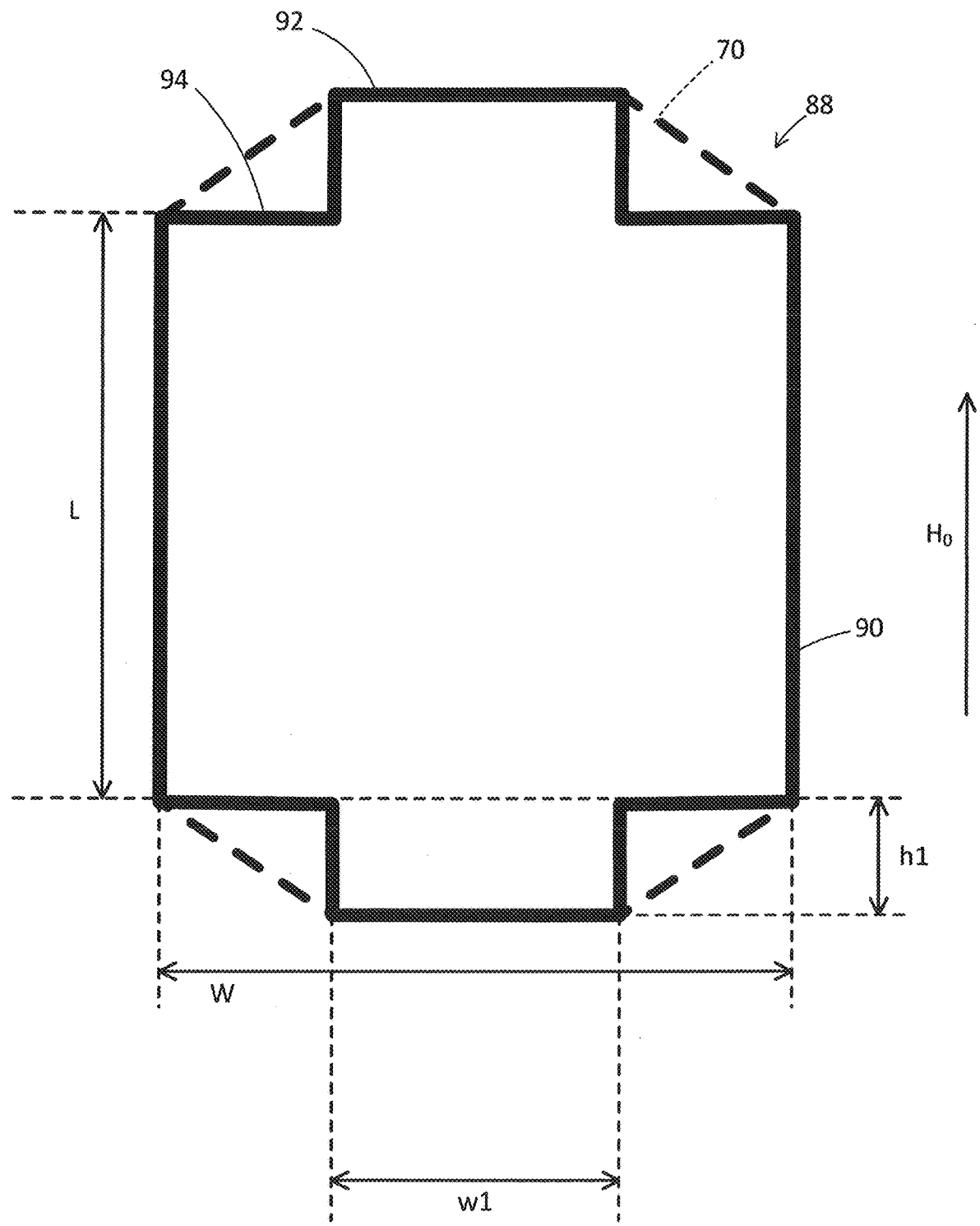
FIG. 9 illustrates a detection coil according to a modified embodiment 2.

A modified embodiment 2 relating to the detection coil according to the above-mentioned embodiment will be described in detail below with reference to FIG. 9. FIG. 9 illustrates a detection coil 88 according to the modified embodiment 2. FIG. 9 additionally illustrates dotted lines indicating the remaining parts 70 of the lateral components of the detection coil 64 according to the above-mentioned embodiment. In an NMR probe according to the modified embodiment 2, a pair of detection coils 88 serve as the above-mentioned detection coils 24A and 24B. Each detection coil 88 is made of a superconductor and has a detection circuit pattern. Although not illustrated in the drawings, the detection coil 88 includes an inductance element L and a capacitance element C. The detection coil 88 includes longitudinal components 90 each extending in parallel with the static magnetic field $H_0$. Coil window length L indicates the entire size of the longitudinal component 90, which is equal to the longitudinal width of the detection coil 54 according to the comparative example (i.e., the entire size of the longitudinal component 56). In the detection coil 88, as an example, the coil window length L of the detection coil 88 is equal to the longitudinal width of the detection region 60 (not illustrated). Coil width W indicates the entire lateral width of the detection coil 88. The detection coil 88 includes lateral components each having a stepwise shape protruding in the direction going away from the detection region 60. According to the example illustrated in FIG. 9, the direction going away from the detection region 60 is the direction parallel to the static magnetic field $H_0$. Needless to say, the direction going away from the detection region 60 can be a direction other than the direction parallel to the static magnetic field $H_0$. A part 92 of the lateral component of the detection coil 88 protrudes in the direction going away from the detection region 60 and is disposed at a position spaced away from the detection region 60, compared to the remaining part 94. The part 92 of the lateral component is a component disposed perpendicularly to the static magnetic field $H_0$. Similarly, the remaining part 94 is a component disposed perpendicularly to the static magnetic field $H_0$. The remaining part 94 of the lateral component is disposed on or in the vicinity of the closest end portion of the detection region 60.

Width w1 indicates the width of the part 92 of the lateral component. The part 92 of the lateral component is disposed at a position spaced away from the closest end portion of the longitudinal component 90 by the distance h1. According to the example illustrated in FIG. 9, one part 92 of the lateral component of the detection coil 88 (i.e., the part 92 of the upper lateral component) is disposed at the position spaced away from the closest end portion of the longitudinal component 90 by the distance h1 in the direction parallel to the static magnetic field $H_0$. Similarly, the part 92 of the other lateral component opposing the above-mentioned lateral component (i.e., the part 92 of the lower lateral component) is disposed at a position spaced away from the closest (the other) end portion of the longitudinal component 90 by the distance h1 in the direction parallel to the static magnetic field $H_0$. More specifically, the detection coil 88 includes the upper and lower lateral components each having the part 92 protruding in the direction parallel to the static magnetic field $H_0$. Needless to say, either the upper lateral component or the lower lateral component can be configured to include the part 92 disposed at the position spaced away from the closest end portion of the longitudinal component 90 by the distance h1. For example, the part 92 of one lateral component can be disposed at the position spaced away from the closest end portion of the longitudinal component 90 by the distance h1, and the part 92 of the other lateral component can be disposed at a position adjacent to the other end portion of the longitudinal component 90, similar to the detection coil 54 according to the comparative example. As another example, the upper lateral component and the lower lateral component can be differentiated in the distance h1 even when both of the parts 92 of the upper and lower lateral components are disposed at the position spaced away from the detection region 60.

The above-mentioned modified embodiment 2 brings preferable effects of eliminating or suppressing the non-uniformity of the magnetic field in the detection region 60, because the part 92 of the lateral component of the detection coil 88 is disposed at the position spaced away from the detection region 60. Further, the modified embodiment 2 brings preferable effects of suppressing the reduction of the sample filling rate of the detection coil 88 as much as possible. Thus, the detection sensitivity can be improved. Further, because the remaining part 94 of the lateral component of the detection coil 88 is disposed on or in the vicinity of the closest end portion of the detection region 60, the reduction of the sample filling rate can be adequately suppressed as compared to a case where the remaining part 94 has a shape spaced away from the detection region 60.

(Modified Embodiment 3)

Figure 10:
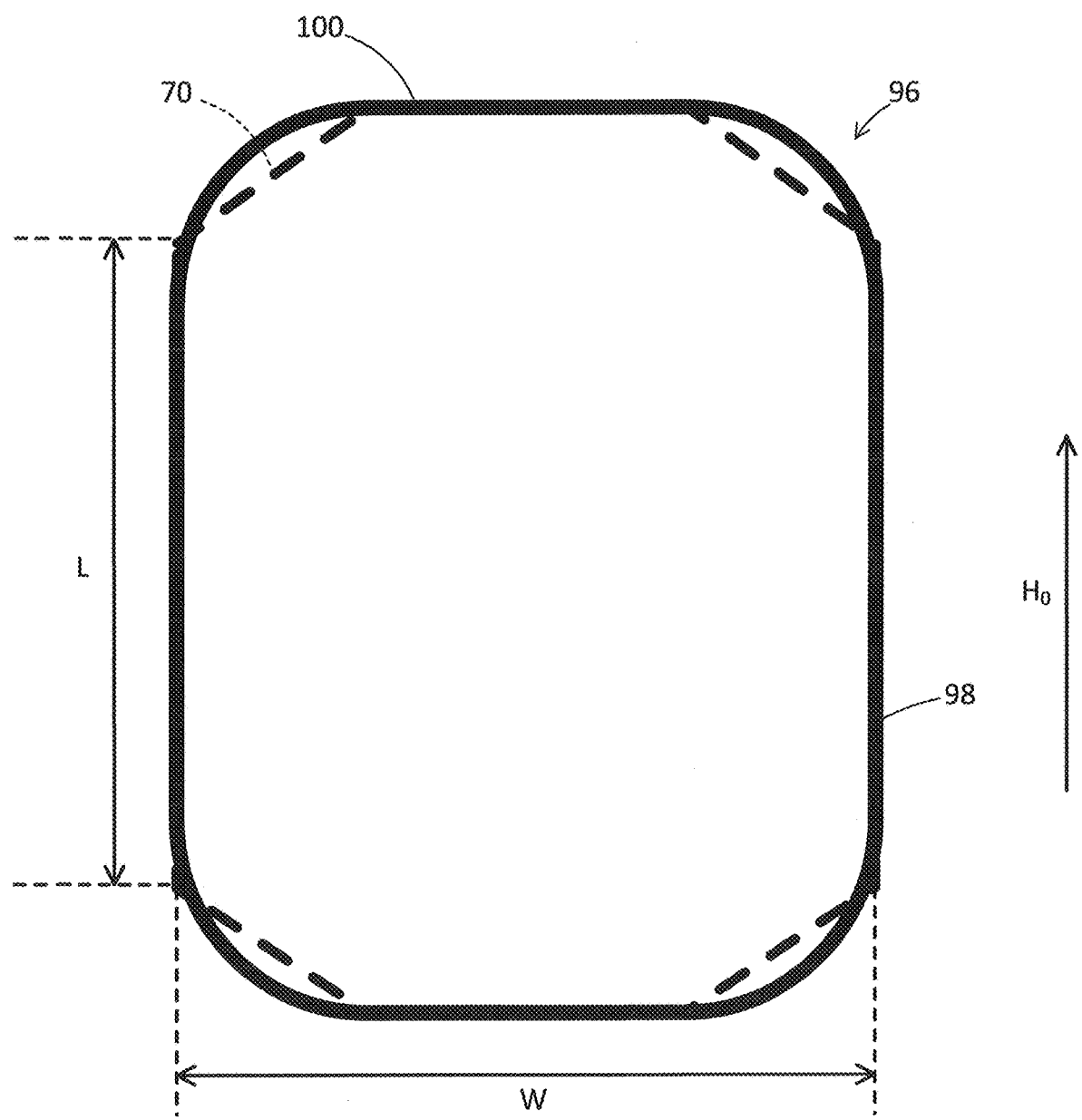
FIG. 10 illustrates a detection coil according to a modified embodiment 3.

A modified embodiment 3 relating to the detection coil according to the above-mentioned embodiment will be described in detail below with reference to FIG. 10. FIG. 10 illustrates a detection coil 96 according to the modified embodiment 3. FIG. 10 additionally illustrates dotted lines indicating the remaining parts 70 of the lateral components of the detection coil 64 according to the above-mentioned embodiment. In an NMR probe according to the modified embodiment 3, a pair of detection coils 96 serve as the above-mentioned detection coils 24A and 24B. Each detection coil 96 is made of a superconductor and has a detection circuit pattern. Although not illustrated in the drawings, the detection coil 96 includes an inductance element L and a capacitance element C. The detection coil 96 includes longitudinal components 98 each extending in parallel with the static magnetic field $H_0$. Coil window length L indicates the entire size of the longitudinal component 98, which is equal to the longitudinal width of the detection coil 54 according to the comparative example (i.e., the entire size of the longitudinal component 56). In the detection coil 96, as an example, the coil window length L of the detection coil 96 is equal to the longitudinal width of the detection region 60 (not illustrated). Coil width W indicates the entire lateral width of the detection coil 96. The detection coil 96 includes lateral components 100 each having a curved shape protruding in the direction going away from the detection region 60. The curved shape can be a semi-elliptic shape or can be a hyperbolic shape. According to the example illustrated in FIG. 10, the direction going away from the detection region 60 is the direction parallel to the static magnetic field $H_0$. Needless to say, the direction going away from the detection region 60 can be a direction other than the direction parallel to the static magnetic field $H_0$.

According to the example illustrated in FIG. 10, one lateral component 100 (i.e., the upper lateral component 100) of the detection coil 96 has a shape protruding in the direction going away from the detection region 60. Similarly, the other lateral component 100 (i.e., the lower lateral component 100) of the detection coil 96 has a shape protruding in the direction going away from the detection region 60. More specifically, the detection coil 96 includes the upper and lower lateral components 100 each having the shape protruding in the direction going away from the detection region 60. Needless to say, either the upper lateral component 100 or the lower lateral component 100 can be configured to have a shape protruding in the direction going away from the detection region 60. As another example, the upper lateral component 100 and the lower lateral component 100 can be differentiated in shape even when both of the upper and lower lateral components 100 have the shape protruding in the direction going away from the detection region 60.

The above-mentioned modified embodiment 3 brings preferable effects of eliminating or suppressing the non-uniformity of the magnetic field in the detection region 60, because the lateral component 100 of the detection coil 96 is disposed at the position spaced away from the detection region 60. Further, the modified embodiment 3 brings preferable effects of suppressing the reduction of the sample filling rate of the detection coil 96 as much as possible. Thus, the detection sensitivity can be improved.

As another modified embodiments, the detection coils according to the above-mentioned embodiment and the modified embodiments 1 and 2 can be configured to have a curved shape. For example, the whole or part of the lateral component can be configured to have a curved shape. Needless to say, the whole or part of the longitudinal component can be configured to have a curved shape.

Further, two lateral components each having the above-mentioned characteristic shape can be selected from the above-mentioned embodiment and the modified embodiments 1, 2, and 3 and adequately combined. For example, the shape of the lateral component of the detection coil 64 according to the above-mentioned embodiment is employable as the shape of one lateral component (e.g., the upper lateral component) of the detection coil. Further, the shape of the lateral component of the detection coil 82 according to the modified embodiment 1 is employable as the shape of the other lateral component (e.g., the lower lateral component). Needless to say, a shape other than the above-mentioned shape is employable as the shape of the lateral component.

(Modified Embodiment 4)

Figure 11:
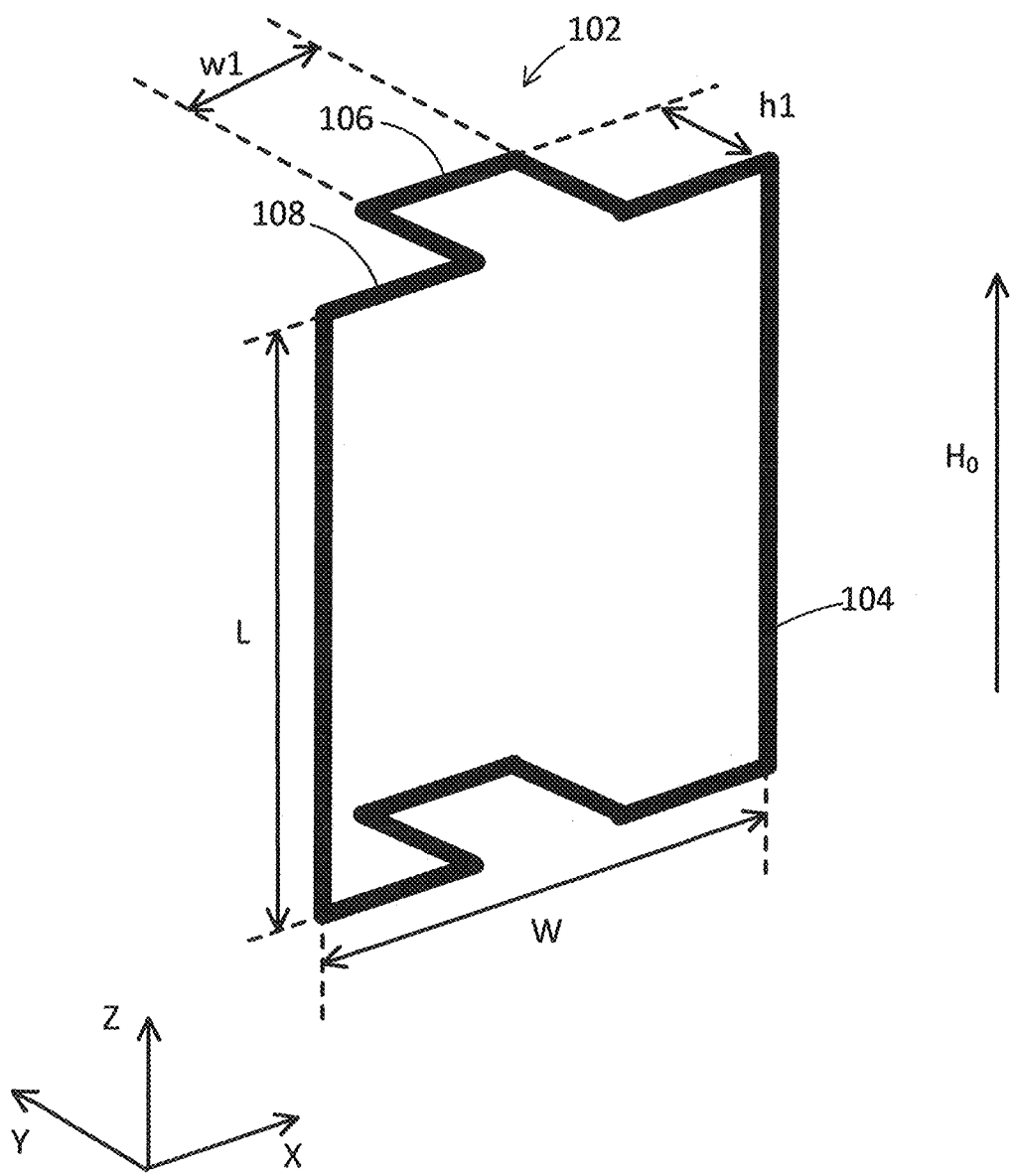
FIG. 11 illustrates a detection coil according to a modified embodiment 4.

Although the detection coils according to the above-mentioned embodiment and the modified embodiments 1, 2, and 3 are planar coils, the detection coil according to the present invention can be configured as a coil having a three-dimensional shape. FIG. 11 illustrates a detection coil 102 having a three-dimensional shape, as a detection coil according to a modified embodiment 4. An NMR probe according to the modified embodiment 4 includes a pair of detection coils 102, which can serve as the above-mentioned detection coils 24A and 24B. The detection coil 102 is made of a superconductor and has a detection circuit pattern. Although not illustrated in the drawings, the detection coil 102 includes an inductance element L and a capacitance element C. The detection coil 102 includes longitudinal components 104 each being disposed in parallel with the static magnetic field $H_0$. Coil window length L indicates the entire size of the longitudinal component 104, which is equal to the longitudinal width of the detection coil 54 according to the comparative example (i.e., the entire size of the longitudinal component 56). In the detection coil 102, as an example, the coil window length L of the detection coil 102 is equal to the longitudinal width of the detection region 60 (not illustrated). Coil width W indicates the entire lateral width of the detection coil 102. Similar to the detection coil 88 according to the modified embodiment 2, the lateral component of the detection coil 102 has a stepwise shape protruding in the direction going away from the detection region 60. The example illustrated in FIG. 11 is different from the modified embodiment 2 in that the direction going away from the detection region 60 is a direction (i.e., Y direction) perpendicular to the direction (i.e., Z direction) of the static magnetic field $H_0$. The direction going away from the detection region 60 can be a direction other than the direction perpendicular to the direction of the static magnetic field $H_0$ and can be a direction intersectional to the static magnetic field $H_0$. The detection coil 102 includes lateral components each having a part 106 protruding in the direction going away from the detection region 60 and being disposed at a position spaced away from the detection region 60 as compared to the remaining part 108. The part 106 of the lateral component is a component disposed perpendicularly to the static magnetic field $H_0$. Similarly, the remaining part 108 is a component disposed perpendicularly to the static magnetic field $H_0$. The remaining part 108 of the lateral component is disposed on or in the vicinity of the closest end portion of the detection region 60.

The width of the part 106 of the lateral component is w1. The part 106 of the lateral component is disposed at a position spaced away from the closest end portion of the longitudinal component 104 by the distance h1. According to the example illustrated in FIG. 11, the part 106 of one lateral component (i.e., the part 106 of the upper lateral component) of the detection coil 102 is disposed at the position spaced away from the closest end portion of the longitudinal component 104 by the distance h1 in the direction perpendicular to the static magnetic field $H_0$. Similarly, the part 106 of the other lateral component opposing the above-mentioned lateral component (i.e., the part 106 of the lower lateral component) is disposed at a position spaced away from the other end portion of the longitudinal component 104 by the distance h1 in the direction perpendicular to the static magnetic field $H_0$. More specifically, in the detection coil 102, both parts 106 of the upper and lower lateral components protrude in the direction perpendicular to the static magnetic field $H_0$. Needless to say, either the upper lateral component or the lower lateral component can be configured to include the part 106 of the lateral component disposed at the position spaced away from the closest end portion of the longitudinal component 104 by the distance h1. For example, the part 106 of one lateral component can be disposed at a position spaced away from the closest end portion of the longitudinal component 104 by the distance h1, and the part 106 of the other lateral component can be disposed at a position adjacent to the other end portion of the longitudinal component 104. As another example, the upper lateral component and the lower lateral component can be differentiated in the distance h1 even when both of the parts of the upper and lower lateral components 106 are disposed at the position spaced away from the detection region 60.

The above-mentioned modified embodiment 4 brings preferable effects of eliminating or suppressing the non-uniformity of the magnetic field in the detection region 60, because the part of the lateral component 106 of the detection coil 102 is disposed at the position spaced away from the detection region 60. Further, the modified embodiment 4 brings preferable effects of suppressing the reduction of the sample filling rate of the detection coil 102 as much as possible. Thus, the detection sensitivity can be improved. Further, because the remaining part 108 of the lateral component of the detection coil 102 is disposed on or in the vicinity of the closest end portion of the detection region 60, the reduction of the sample filling rate can be adequately suppressed as compared to a case where the remaining part 108 has a shape spaced away from the detection region 60.

As another modified embodiment, the detection coils according to the above-mentioned embodiment and the modified embodiments 1 and 3 can be configured to include a lateral component protruding in a direction intersectional to the static magnetic field $H_0$.

The invention claimed is:

1. A magnetic resonance signal detection module, comprising:
   a pair of detection coils, one detection coil provided on each side of a sample container across a width of the sample container,
   wherein each detection coil is made of a superconductor and has an electric circuit pattern capable of detecting a magnetic resonance signal from a sample, and
   each detection coil includes:
   a pair of lateral components perpendicular to a static magnetic field, wherein each of the lateral components having a protruding part disposed at a position spaced away from a detection region of the sample, as compared to a remaining part of the lateral component, wherein a width of the lateral component defines a width of a coil window; and
   a pair of longitudinal components parallel to the static magnetic field, wherein a length of each of the longitudinal components defines a length of the coil window of the detection coil and the length of the coil window is equal to a longitudinal width of the detection region of the sample, wherein the coil window defines a plane that is parallel to the static magnetic field; and
   wherein the protruding parts of each of the lateral components are disposed at a position spaced away from the detection region in a direction perpendicular to the static magnetic field, wherein each of the protruding parts has a notch shape extending in the direction perpendicular to the direction of the static magnetic field and extending perpendicular to the plane of the coil window.

2. The magnetic resonance signal detection module according to claim 1, wherein the width of the protruding part of the lateral component is 1.1 to 2.0 times the width of the sample container.

3. The magnetic resonance signal detection module according to claim 1, further comprising a coupling coil to generate a variable magnetic field during an irradiation time zone.

4. The magnetic resonance signal detection module according to claim 3, wherein the coupling coil is further to receive a nuclear magnetic resonance (NMR) signal during an observation time zone.

5. The magnetic resonance signal detection module according to claim 1, wherein at least one detection coil of the pair of detection coils comprises a thin-film detection circuit pattern formed on a substrate.

6. The magnetic resonance signal detection module according to claim 1, wherein the detection region comprises a measurement target region and is determined in relation to the sample such that the pair of detection coils detect an NMR signal from the sample disposed in the detection region during a measurement of the sample.

7. The magnetic resonance signal detection module according to claim 1, wherein each of the notch shapes extends in a plane that intersects the static magnetic field.

* * * * *